(12) United States Patent
Anderson (10) Patent No.: US 7,102,442 B2
(45) Date of Patent: Sep. 5, 2006

(54) WIRELESS TERMINALS, METHODS AND COMPUTER PROGRAM PRODUCTS WITH TRANSMIT POWER AMPLIFIER INPUT POWER REGULATION

(75) Inventor: William David Anderson, Chapel Hill, NC (US)

(73) Assignee: Sony Ericsson Mobile Communications AB, Lund (SE)

( * ) Notice: Subject to any disclaimer, the term of this patent is extended or adjusted under 35 U.S.C. 154(b) by 0 days.

(21) Appl. No.: 10/833,655

(22) Filed: Apr. 28, 2004

(65) Prior Publication Data

US 2005/0242882 A1 Nov. 3, 2005

(51) Int. Cl.
*H03G 3/10* (2006.01)
(52) U.S. Cl. ..................... 330/285; 330/297
(58) Field of Classification Search ............ 330/285, 330/296, 297, 261
See application file for complete search history.

(56) References Cited

U.S. PATENT DOCUMENTS

| | | | |
|---|---|---|---|
| 5,744,944 A * | 4/1998 | Danstrom | 323/284 |
| 5,999,829 A | 12/1999 | Chun et al. | |
| 6,008,698 A * | 12/1999 | Dacus et al. | 330/279 |
| 6,081,161 A | 6/2000 | Dacus et al. | |
| 6,298,222 B1 | 10/2001 | Bergveld et al. | |
| 6,430,402 B1 * | 8/2002 | Agahi-Kesheh | 455/115.3 |
| 6,522,202 B1 * | 2/2003 | Brandt | 330/285 |
| 6,646,511 B1 * | 11/2003 | Canyon et al. | 330/297 |
| 6,897,730 B1 * | 5/2005 | Dupuis et al. | 330/297 |
| 2003/0090325 A1 | 5/2003 | Canyon et al. | |

FOREIGN PATENT DOCUMENTS

| | | |
|---|---|---|
| EP | 0 597 448 A1 | 5/1994 |
| WO | WO98/49771 | 11/1998 |

OTHER PUBLICATIONS

Notification of Transmittal of the International Search Report and the Written Opinion of the International Searching Authority, or the Declaration, PCT/US2004/037333, Feb. 24, 2005.

* cited by examiner

*Primary Examiner*—Henry Choe
(74) *Attorney, Agent, or Firm*—Myers Bigel Sibley & Sajovec PA (57) ABSTRACT

A transmit power amplifier of a wireless terminal is controlled by determining a power supply voltage applied to the transmit power amplifier, determining a power supply current provided to the transmit power amplifier, determining a relationship of the determined power supply current and the determined power supply voltage, and controlling the power supply voltage responsive to the determined relationship of the power supply current and the power supply voltage. For example, determining a relationship of the determined power supply current and the determined power supply voltage may include determining whether the power supply current meets a predetermined criterion, e.g., a predetermined current range, associated with the determined power supply voltage. The invention may be embodied as apparatus, methods, and computer program products.

29 Claims, 8 Drawing Sheets

WIRELESS TERMINALS, METHODS AND COMPUTER PROGRAM PRODUCTS WITH TRANSMIT POWER AMPLIFIER INPUT POWER REGULATION

BACKGROUND OF THE INVENTION

The present invention relates to wireless terminals and operation thereof, and more particularly, to transmit power amplifiers and operations thereof.

Transmitters in wireless terminals, such cellular handsets, often are designed based on an assumption that the power amplifier of the transmitter drives an approximately 50 ohm antenna impedance. However, antennas for such devices are increasingly being adapted for use over multiple bands and being integrated into the handset housing, which may cause significant divergence of antenna impedance from the 50 ohm assumption under a wide array of operating conditions. For example, in some newer antenna designs, voltage standing wave ratio (VSWR) may be nominally better than 3:1, but can go to 6:1 or worse when a user simply places a hand or other object near the antenna. The amount of power that can be transmitted through an antenna is affected by impedance matching between the amplifier and the antenna impedance, and poor impedance matching between the transmit power amplifier and the antenna can negatively affect the ability to maintain a call.

Some wireless terminals use closed-loop techniques to control a bias of the transmit power amplifier. Some conventional terminals directly sense the output of the power amplifier using, for example, a diode or other detector coupled to the radio frequency (RF) output of the power amplifier, and adjust the bias voltage and/or the signal input to the power amplifier responsive to the detected output. Such techniques, while effective, may require relatively complex and costly circuitry. Other closed loop techniques involve regulating power supply current provided to the amplifier. For example, a cellular handset may include circuitry that measures the power supply current to the power amplifier and adjusts the bias voltage applied to the power amplifier to maintain a substantially constant power supply current to the power amplifier. Such a technique can be relatively easily and inexpensively implemented, and may work well when the antenna impedance is relatively constant.

SUMMARY OF THE INVENTION

According to some embodiments of the present invention, a transmit power amplifier of a wireless terminal is controlled by determining a power supply voltage applied to the transmit power amplifier, determining a power supply current provided to the transmit power amplifier, determining a relationship of the determined power supply current and the determined power supply voltage, and controlling the power supply voltage responsive to the determined relationship of the power supply current and the power supply voltage. For example, determining a relationship of the determined power supply current and the determined power supply voltage may include determining whether the power supply current meets a predetermined criterion, e.g., a predetermined current range, associated with the determined power supply voltage.

In some embodiments of the present invention, the terminal is configured to provide a plurality of discrete power supply voltage settings. A current power supply voltage setting of the plurality of discrete power supply voltage settings is identified. A power supply current provided to the transmit power amplifier for the current power supply voltage setting is determined. A relationship of the determined power supply current and the current power supply voltage setting is determined. The current power supply voltage setting is maintained if the determined power supply current is within a range of power supply currents associated with the current power supply voltage setting. A new power supply voltage setting is selected from the plurality of discrete power supply voltage settings if the determined power supply current is outside of the range of power supply currents associated with the current power supply voltage setting.

According to certain embodiments of the present invention, a lookup table correlates respective ones of the plurality of discrete power supply voltage settings to respective ranges of power supply currents. The lookup table is accessed to determine whether the determined power supply current is within the stored range of power supply currents associated with the current power supply voltage setting.

In some embodiments of the present invention, the wireless terminal supports a plurality of operating modes for communicating according to respective communications protocols. The power supply voltage to the transmit power amplifier may be controlled responsive to a relationship of transmit power amplifier power supply voltage and current in only a subset of the plurality of modes.

According to additional embodiments of the present invention, DC power delivered to a power supply input of a transmit power amplifier of a wireless terminal is regulated to conform to a predetermined power criterion. For example, regulating a DC power delivered to the power supply input may include adjusting a power supply voltage provided to the power amplifier to conform the DC power delivered to the power supply input to the predetermined power criterion. Adjusting a power supply voltage provided to the power amplifier to conform the DC power delivered to the power supply input to the predetermined power criterion may include adjusting the power supply voltage to maintain the DC power delivered to the power supply input within a predetermined range, e.g., substantially constant over a range of load impedances coupled to an output of the power amplifier.

In further embodiments of the present invention, a wireless terminal includes a radio communications circuit including a transmit power amplifier. The wireless terminal further includes a power regulator circuit electrically coupled to the radio communications circuit and operative to conform a DC power delivered to a power supply input of the power amplifier to a predetermined power criterion.

According to additional embodiments of the present invention, a wireless terminal includes a radio communications circuit that includes a transmit power amplifier. The terminal further includes a power regulator circuit electrically coupled to the radio communications circuit. The power regulator circuit is operative to determine a relationship between a power supply voltage applied to the transmit power amplifier and a resultant power supply current of the transmit power amplifier and to control the power supply voltage responsive to the determined relationship of the power supply current and the power supply voltage.

Additional embodiments of the present invention provide a computer program product for controlling a wireless terminal. The computer program product includes program code embodied in a computer readable medium. The program code includes program code configured to determine a power supply voltage applied to the transmit power amplifier, program code configured to determine a power supply current provided to the transmit power amplifier, program code configured to determine a relationship of the determined power supply current and the determined power supply voltage, and program code configured to control the power supply voltage responsive to the determined relationship of the power supply current and the power supply voltage.

DETAILED DESCRIPTION OF EXEMPLARY EMBODIMENTS

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. Like numbers refer to like elements throughout.

It also will be understood that, as used herein, the terms "comprising", "comprises", "includes" and "including" are open-ended, i.e., refer to one or more stated elements, steps and/or functions without precluding one or more unstated elements, steps and/or functions. It will also be understood that the term "and/or" as used herein refers to and encompasses any and all possible combinations of one or more of the associated listed items.

The present invention is described below with reference to block diagrams and/or operational illustrations of methods and wireless terminals according to embodiments of the invention. It will be understood that each block of the block diagrams and/or operational illustrations, and combinations of blocks in the block diagrams and/or operational illustrations, can be implemented by radio frequency, analog and/or digital hardware, and/or computer program instructions. These computer program instructions may be provided to a processor of a general purpose computer, special purpose computer, ASIC, and/or other programmable data processing apparatus, such that the instructions, which execute via the processor of the computer and/or other programmable data processing apparatus, create means for implementing the functions/acts specified in the block diagrams and/or operational block or blocks. In some alternate implementations, the functions/acts noted in the blocks may occur out of the order noted in the operational illustrations. For example, two blocks shown in succession may in fact be executed substantially concurrently or the blocks may sometimes be executed in the reverse order, depending upon the functionality/acts involved.

As used herein, a "wireless terminal" or "mobile terminal" includes, but is not limited to, a terminal that is configured to communicate via a wireless interface such as, for example, a cellular interface, a wireless local area network interface (WLAN), Bluetooth interface, another RF communication interface, and/or an optical interface. Example wireless terminals include, but are not limited to, a cellular wireless terminal; a personal communication terminal that may combine a cellular wireless terminal with data processing, facsimile and data communications capabilities; a personal data assistance (PDA) that can include a wireless transceiver, pager, Internet/intranet access, local area network interface, wide area network interface, Web browser, organizer, and/or calendar; and a mobile or fixed computer or other device that includes a wireless transceiver. The wireless terminal may be configured to communicate via a cellular communication link that may include a protocol such as, for example, ANSI-136, Global Standard for Mobile (GSM) communication, General Packet Radio Service (GPRS), enhanced data rates for GSM evolution (EDGE), code division multiple access (CDMA), wideband-CDMA, CDMA2000, and UMTS.

Computer program code for carrying out operations of the present invention may be written in an object oriented programming language such as Java®, Smalltalk or C++, a conventional procedural programming languages, such as the "C" programming language, or lower-level code, such as assembly language and/or microcode. The program code may execute entirely on a single processor and/or across multiple processors, as a stand-alone software package or as part of another software package.

Certain embodiments of the present invention arise from a realization that constant-current power amplifier control can lead to overcompensation and/or undercompensation for varying antenna impedances in some applications. For example, the inventors have discovered that for an RF9388 power amplifier module (manufactured by RF Micro Devices, Inc., Greensboro N.C.), the following equation can accurately model power output $P_{out}$ in a region near max power:

$$P_{out} = (V_{PA} - V_C)^2 * K, \quad (1)$$

where $V_{PA}$ is the power supply (collector) voltage provided to the power amplifier module, $V_C$ is a constant approximately equal to 0.6 volts and K is a constant approximately equal to 0.4. It has been discovered that the core power amplifier efficiency does not substantially vary as the collector voltage $V_{PA}$ is changed in a neighborhood around maximum power.

Accordingly, the power supply current $I_{PA}$ of the power amplifier may be expressed as:

$$I_{PA} = \frac{(V_{PA} - V_C)^2 * K}{V_{PA} * \eta}, \quad (2)$$

where $\eta$ is the power amplifier efficiency, which generally depends on the load impedance of the power amplifier. From equation (2), it can be seen that, as the collector voltage $V_{PA}$ changes, the output power $P_{out}$ changes more rapidly than the power supply current $I_{PA}$. For example, for the values given, a 10% increase in the collector voltage $V_{PA}$ increases the power supply current by around 15% and increases the power $P_{out}$ by around 26%.

Figure 1:
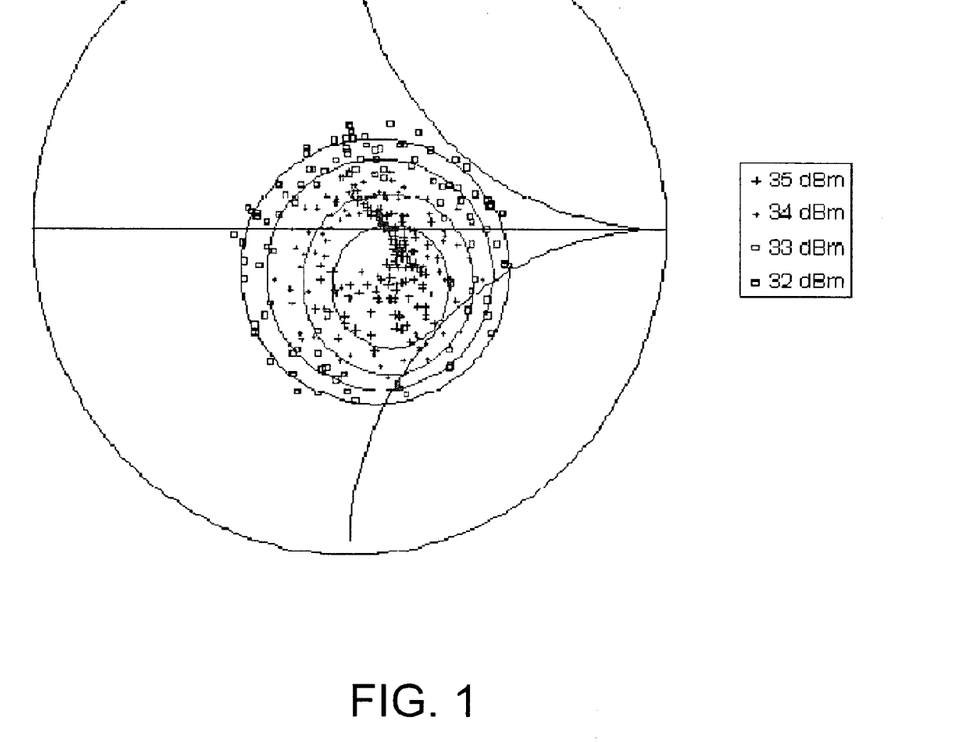
FIGS. 1–3 are charts illustrating measured output power, power amplifier power supply current, and efficiency for a cellular handset power amplifier as a function of load impedance.
Figure 2:
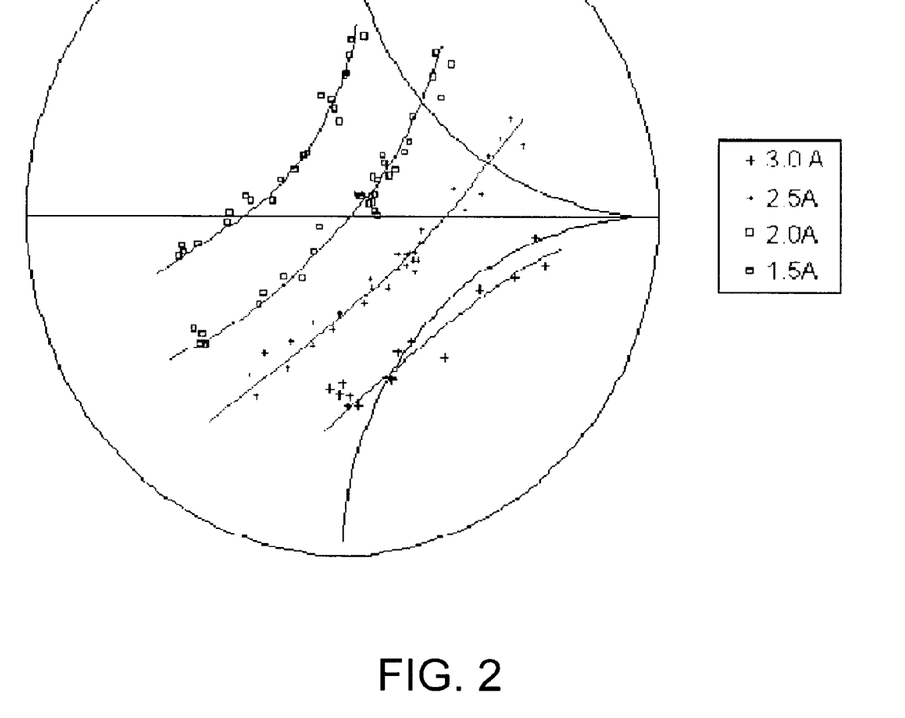
Figure 3:
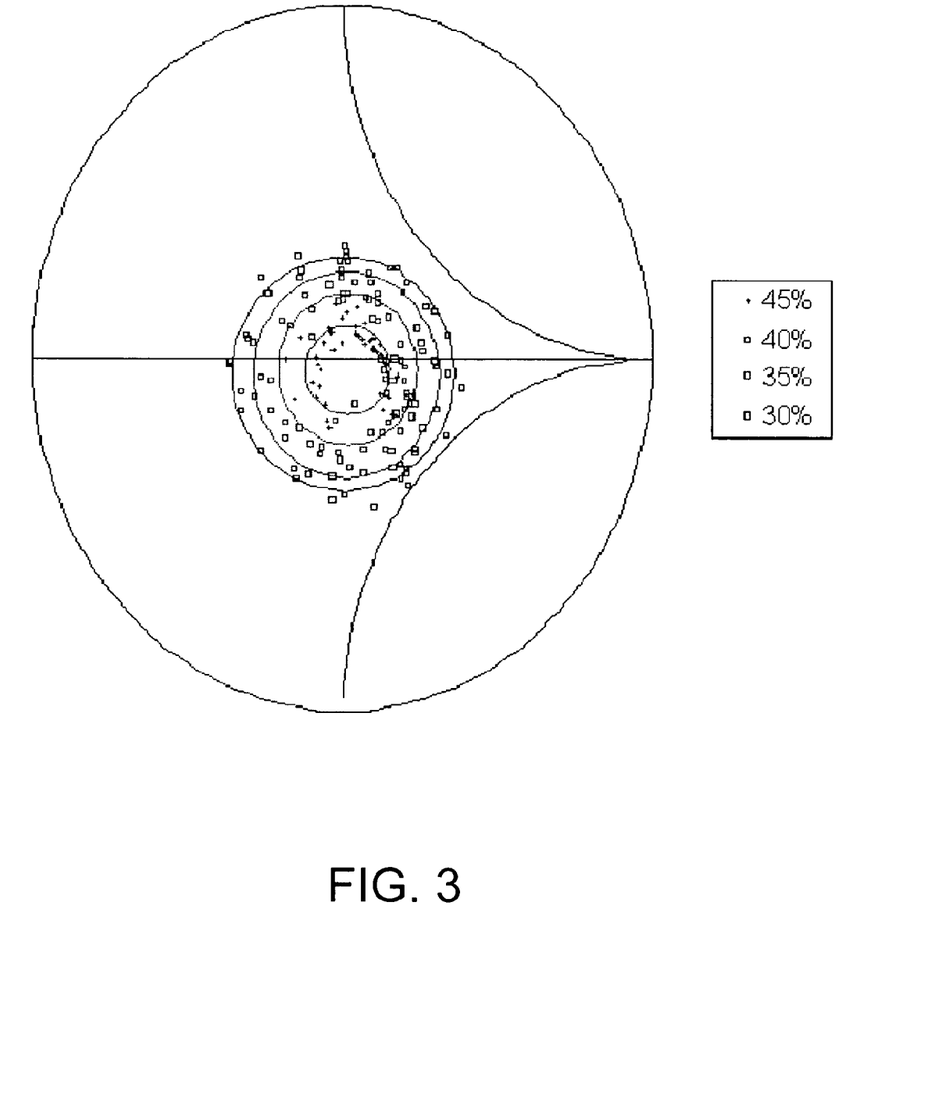

FIGS. 1–3 are charts illustrating measured output power, power amplifier power supply current $I_{PA}$, and efficiency η, respectively, as a function of load impedance for a power supply voltage $V_{PA}$ of 3.2 volts. As can be seen from FIG. 3, the efficiency circles are generally centered on 50 ohms, which indicates that, if efficiency does not substantially change with the power supply voltage $V_{PA}$, then keeping DC power delivered to the power amplifier substantially constant can keep output power substantially constant. According to some embodiments of the present invention, the DC power delivered to a power amplifier may be regulated (e.g., kept substantially constant and/or within some predetermined envelope) to provide advantageous performance over a range of load impedances, which contrasts with power supply current control as used in some conventional devices. Such power regulation may include, for example, direct determination and control of the DC input power or control of a relationship between the power supply voltage and current.

Figure 4:
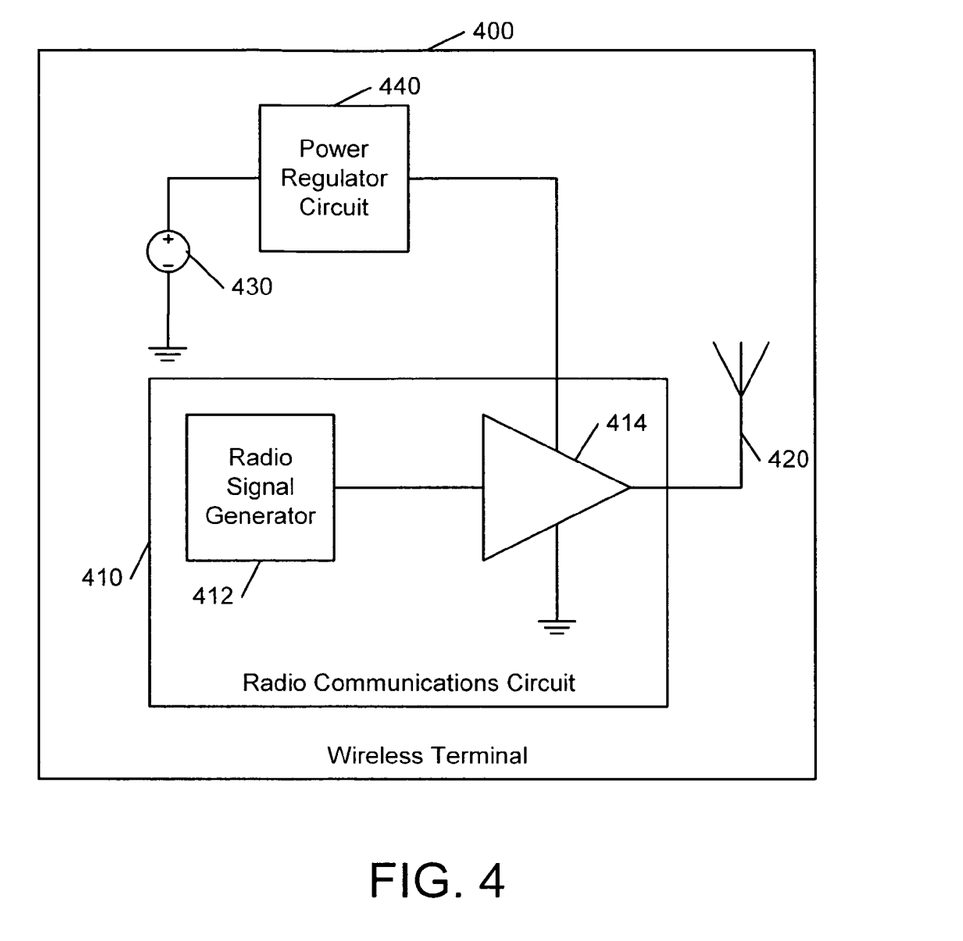
FIG. 4 is a schematic block diagram illustrating a wireless terminal according to some embodiments of the present invention.

FIG. 4 illustrates a wireless terminal 400 according to some embodiments of the present invention. The terminal 400 includes a radio communications circuit 410 including a transmit power amplifier 414 that drives an antenna 420 responsive to a signal generated by a radio signal generator circuit 412. It will be appreciated that the radio communications circuit 410, including the radio signal generator circuit 412, may include various components, including, but not limited to, microprocessors, digital signal processors, memory circuits, and the like. For clarity of illustration, such components are not illustrated, and their functions are well known to those skilled in that art and will not be discussed in greater detail herein.

The wireless terminal 400 further includes a power source 430, such as a battery and/or an AC/DC converter circuit, that provides power for operation of the transmit power amplifier 414, and which may also power other components of the terminal 400, such as the radio signal generator circuit 412. Power supplied to the transmit power amplifier 414 is controlled by a power regulator circuit 440, i.e., a circuit that conforms DC power delivered to the transmit power amplifier 414 to a predetermined power criterion. For example, along lines described above, the power regulator circuit 440 may be configured to maintain the DC power delivered to the power amplifier 414 within a predetermined range, e.g., such that DC power delivered to the power amplifier is substantially constant over a range of antenna load impedances coupled to the output of the power amplifier 414.

Figure 5:
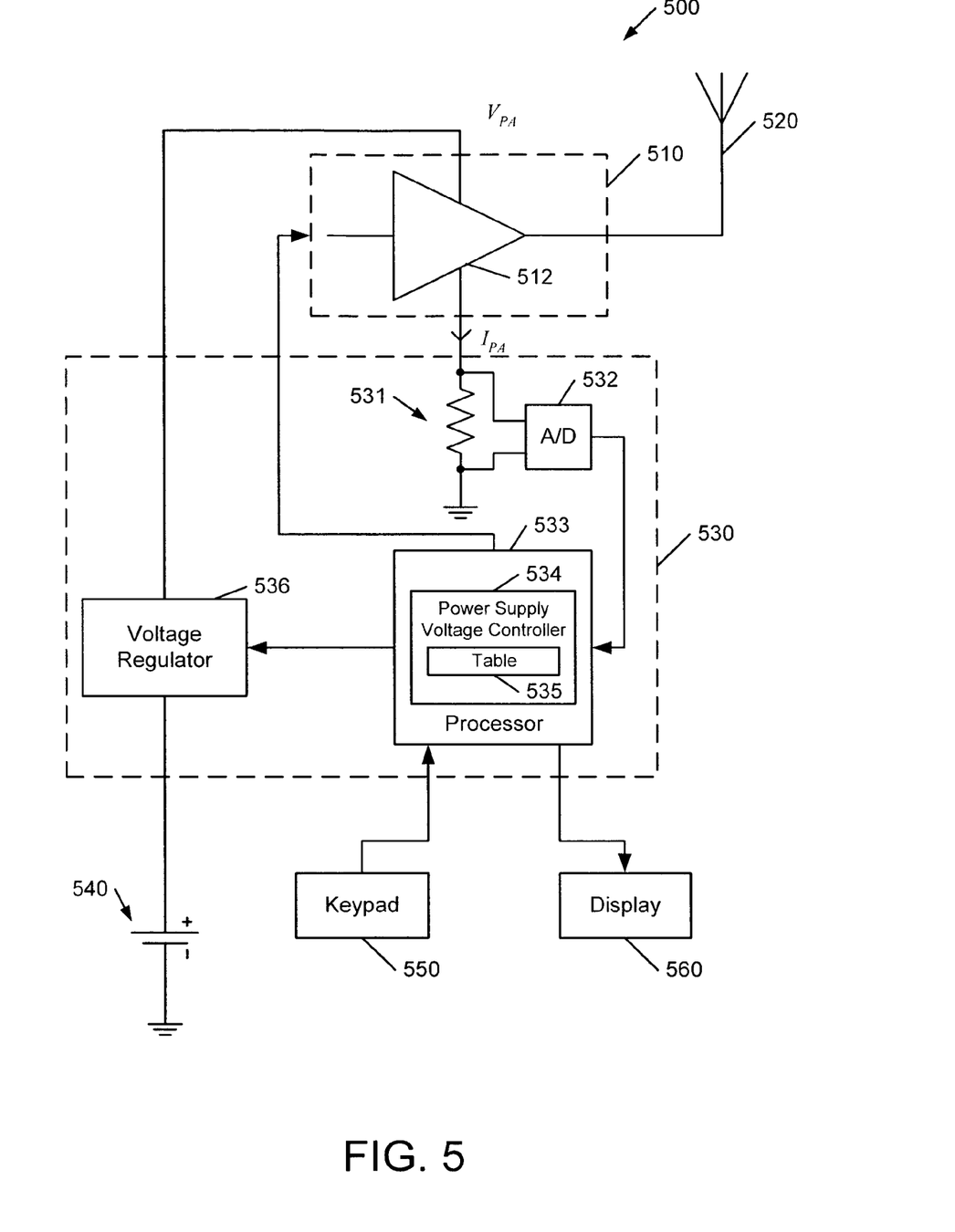
FIG. 5 is a schematic block diagram illustrating a wireless terminal according to further embodiments of the present invention.

FIG. 5 illustrates a wireless terminal 500 according to further embodiments of the present invention. The terminal 500 includes a radio communications circuit 510 including a transmit power amplifier 512 configured to drive an antenna 520. The terminal 500 further includes a battery 540 and a power regulator circuit 530, which includes a voltage regulator circuit 536 that applies a voltage $V_{PA}$ to a power supply input 511 of the power amplifier 512. The power regulator circuit 530 includes a current sense resistor 531 that develops a voltage representative of a power supply current $I_{PA}$ of the power amplifier 512. The voltage is converted by an A/D converter 532 to a digitized value representative of the current $I_{PA}$, and sent to a processor (e.g., a microprocessor or microcontroller) 533. The processor 533, which may also be operatively associated with other components of the terminal 500, such as a keypad 550 and/or display 560, is configured to provide a power supply voltage controller 534 that commands the voltage regulator circuit 536. In particular, the power supply voltage controller 534 may be configured to control the voltage regulator 536 to vary the power supply voltage $V_{PA}$ responsive to the power supply current $I_{PA}$ such that DC power delivered to the amplifier 512 (or some other relationship between the power supply voltage $V_{PA}$ and the power supply current $I_{PA}$) meets a predetermined criterion.

It will be appreciated that such power regulation may be achieved in a number of different ways. For example, the power supply voltage controller 534 may explicitly compute the DC power delivered to the power amplifier 512, e.g., by multiplying the sensed current $I_{PA}$ by the known (or sensed) power supply voltage $V_{PA}$, and may responsively adjust the power supply voltage $V_{PA}$ according to the result of this computation. Alternatively, as illustrated in FIG. 5, an implicit power criterion may be implemented by storing a lookup table 535 that correlates the detected power supply current $I_{PA}$ with the power supply voltage $V_{PA}$.

For example, the lookup table 535 may store information that relates various power supply voltage settings with respective ranges of power supply currents, e.g., lower and upper limits that could be used to determine whether a current power supply voltage setting should be maintained or a new power supply voltage setting should be command. Table I illustrates an example of such a table (where VPA_SETTING represents a power supply voltage setting):

TABLE I

| VPA_SETTING | $I_{PA}$ lower limit | $I_{PA}$ upper limit |
|---|---|---|
| +3 | — | 1.38 A |
| +2 | 1.38 A | 1.56 A |
| +1 | 1.56 A | 1.74 A |
| 0 | 1.74 A | 1.92 A |
| −1 | 1.92 A | 2.05 A |
| −2 | 2.05 A | 2.14 A |
| −3 | 2.14 A | 2.23 A |
| −4 | 2.23 A | 2.32 A |
| −5 | 2.32 A | — |

Figure 6:
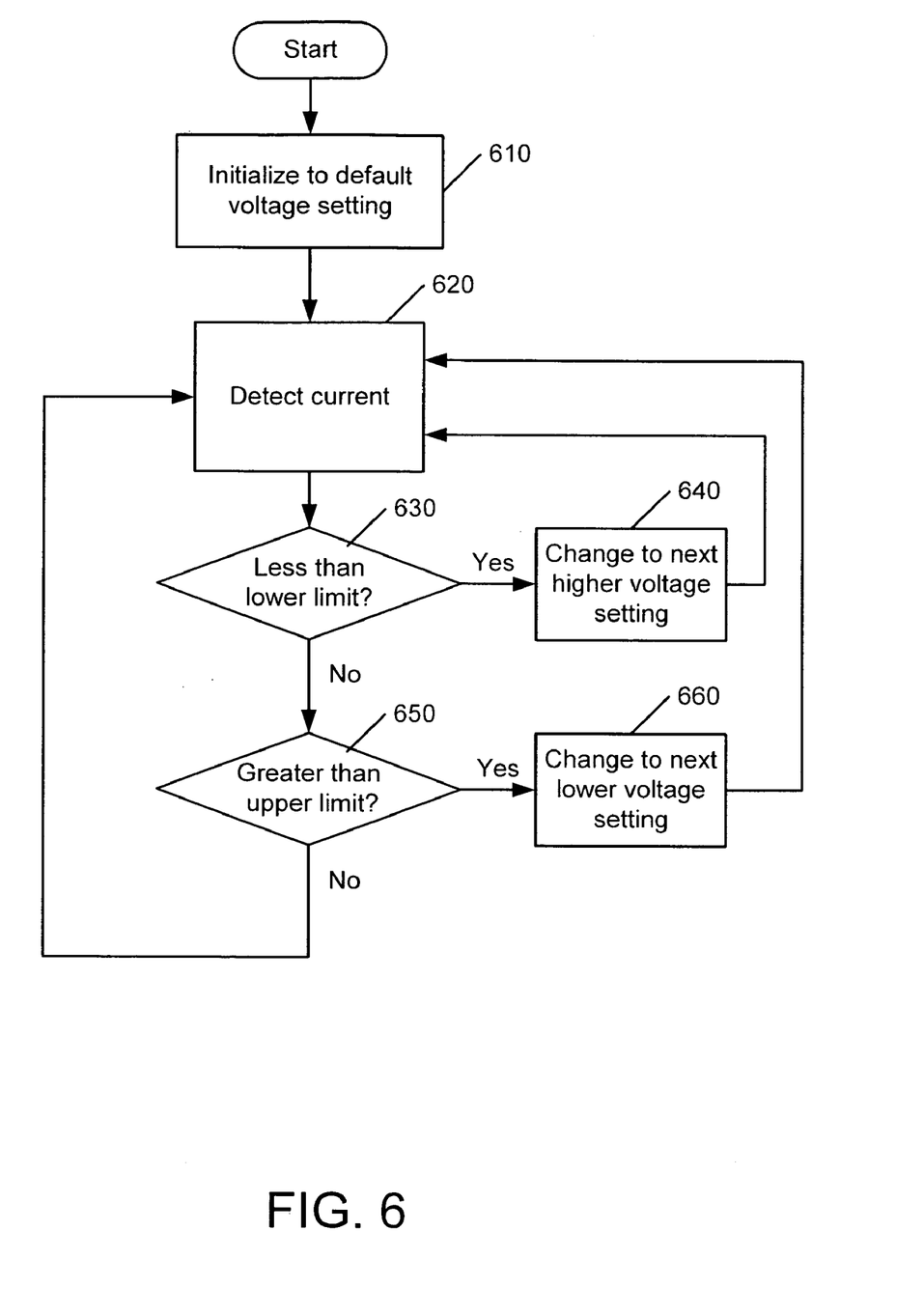
FIG. 6 is a flowchart illustrating exemplary operations of a wireless terminal according to further embodiments of the present invention.

Such a table may be used as illustrated in FIG. 6. Referring to FIG. 6, the terminal may be initialized to a default power supply voltage setting (e.g., VPA_SETTING=0) (Block 610). Such initialization may occur, for example, upon call setup. Power supply current for the transmit power amplifier is then detected (Block 620). Such detection may occur during a transmit burst, and may include filtering or averaging over a specified time interval and/or number of bursts. The detected current is then checked to see if it is within the range of currents associated with the current power supply voltage setting, e.g., whether the current is less than the lower limit or greater than the upper limit (Blocks 630, 650).

If the detected current is less than the lower limit, the controller selects the next higher voltage setting (e.g., VPA_SETTING=1) (Block 640), and proceeds to again sense the power supply current and compare the current to the range of currents associated with the new setting (Blocks 620, 630, 650). If the detected current is greater than the upper limit, the controller selects the next lower voltage setting (e.g., VPA_SETTING=−1) (Block 660), and proceeds to again sense the power supply current and compare the current to the range of currents associated with the new setting (Blocks 620, 630, 650). If the detected current is within the range associated with the current voltage setting, the controller maintains the current voltage setting. It will be appreciated that, although the illustrated embodiments show non-overlapping current ranges, some embodiments of the present invention may use overlapping current ranges, which may provide improved resistance to oscillation (albeit with potentially reduced accuracy). In addition, although the operations illustrated in FIG. 6 show incremental power supply voltage setting changes, some embodiments may be capable of non-incremental changes, e.g., changes of VPA_SETTING that are greater than 1, based on the magnitude of differences between the detected current and the current power supply voltage range. It will be appreciated that, due to stability considerations, the rate at which power supply voltage setting changes are effected preferably is less than the rate at which the power supply current is determined.

A power amplifier power regulator circuit, such as the power regulator circuit 530 of FIG. 5, may provide a substantially constant (i.e., within predetermined limits) DC power input to the power amplifier and/or may provide a DC power input that meets some other constraint. For example, a power regulator may simply constrain power to be less than some predetermined maximum, and may maintain constant current as long as power is within that limit. In other embodiments, a lookup table may be configured to provide substantially constant DC input power over a certain range of load (antenna) impedances, voltages and/or currents, and to provide a hard power limit outside of this range. A power amplifier power supply regulator circuit according to some embodiments of the present invention may also be configured to provide power regulation along the lines described above for only selected operational modes of the wireless terminal, or may provide different DC input power criterion for respective operating modes. For example, a GSM-compliant wireless terminal configured to provide operation in GMSK and 8PSK modes may include a power amplifier power regulator that provides substantially constant DC input power only in the GMSK mode.

Figure 7:
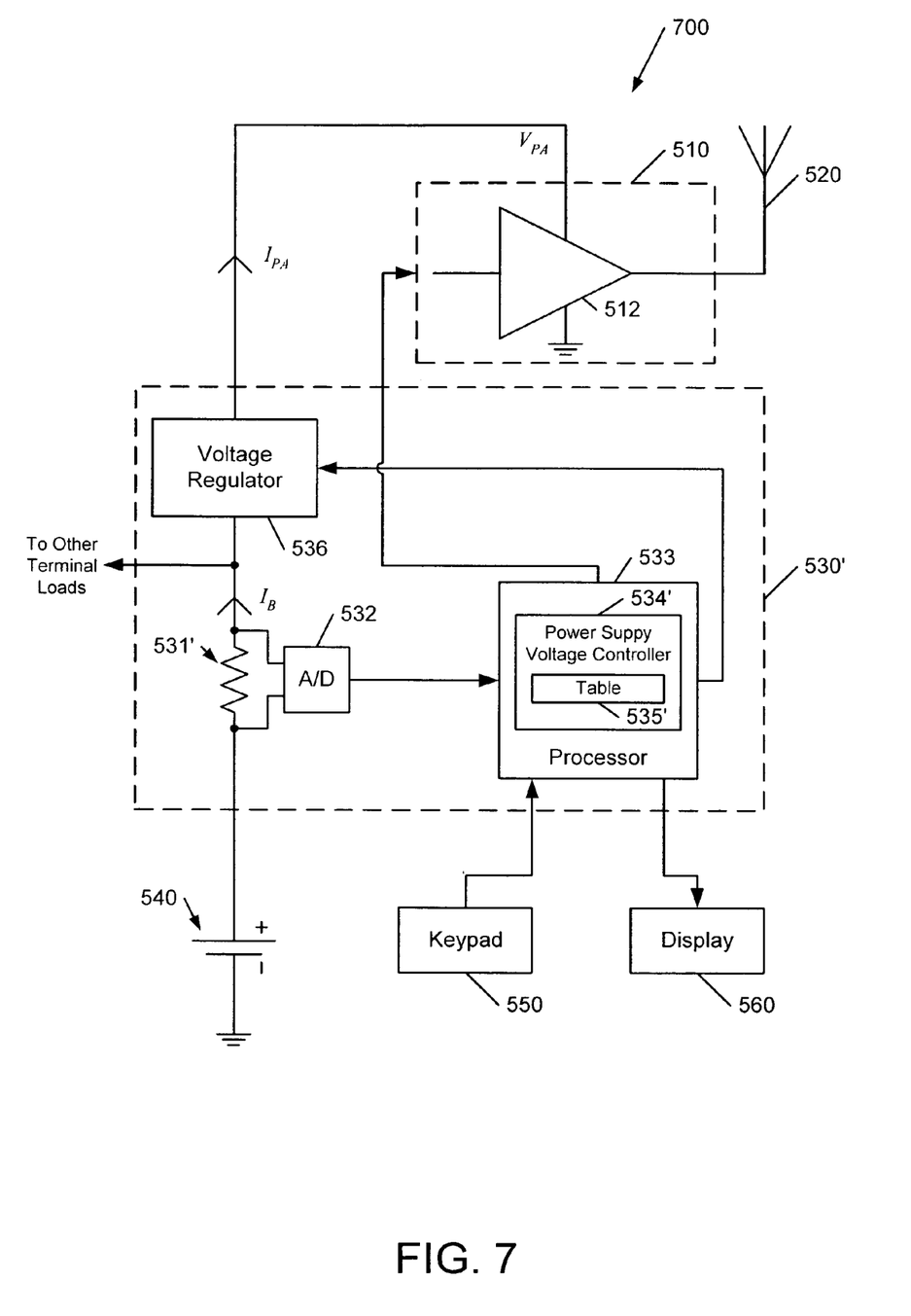
FIG. 7 is a schematic block diagram illustrating a wireless terminal according to additional embodiments of the present invention.

Power amplifier current and/or voltage may be determined in a number of different ways within the scope of the present invention. FIG. 7 illustrates a wireless terminal 700 according to further embodiments of the present invention, where like components of the terminals 500 and 700 in FIGS. 5 and 7 are indicated by like reference numbers. The terminal 700 differs from the terminal 500 in that the power supply current to the power amplifier 512 is regulated by a power regulator circuit 530' by sensing a current $I_B$ drawn from the terminal's battery 540 using a current sense resistor 531' coupled in series with the battery 540. As shown, a voltage developed across the resistor 531' is sensed by an A/D converter 532, which provides a digital representation of the battery current $I_B$ to a processor 533 that is configured to provide a power controller 534' and a lookup table 535' that correlates the sensed battery current $I_B$ to the power supply voltage setting of a power supply voltage regulator 536 that controls the power supply voltage $V_{PA}$ provided to the power amplifier 512.

Figure 8:
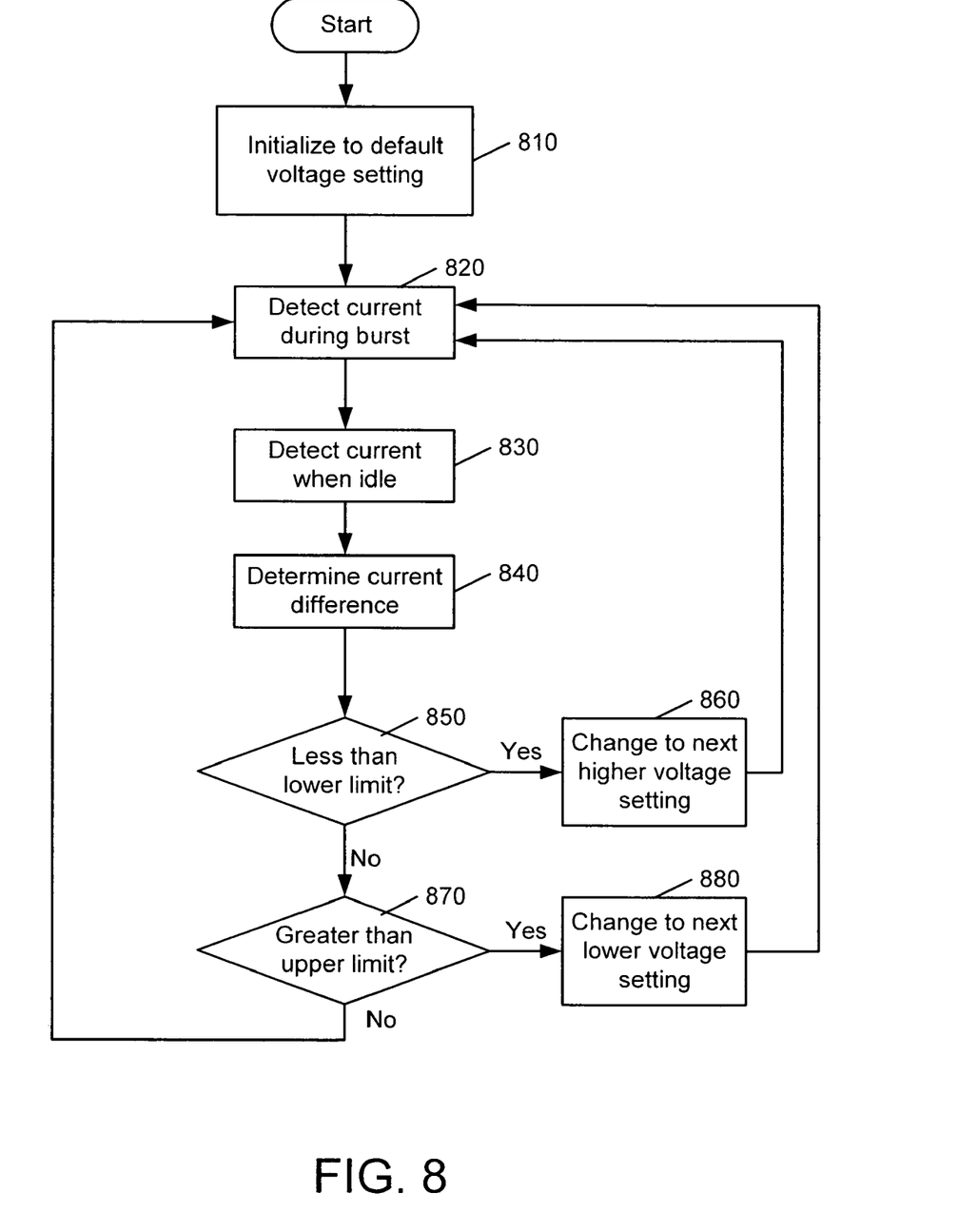
FIG. 8 is a flowchart illustrating exemplary operations of a wireless terminal according to still further embodiments of the present invention.

As shown in FIG. 8, an approximation of the power supply current $I_{PA}$ to the amplifier 512 may be obtained by assuming that a difference between the battery current $I_B$ during a transmit burst and the battery current $I_B$ when the transmitter is idle is representative of the power amplifier power supply current $I_{PA}$. Referring to FIG. 8, the power supply voltage setting (e.g., VPA_SETTING) is initialized to a default value (Block 810). Current drawn from the battery 540 is detected during a transmit burst (Block 820) and when the transmitter is idle (Block 830). The controller then approximates the power amplifier power supply current as a difference between the two currents (Block 840), and compares the approximated power amplifier power supply current with lower and upper limits associated with the current power supply voltage setting (Blocks 850, 870). If the approximated current is less than the lower limit, the power supply voltage is increased (Block 860). If the approximated current is greater than the upper limit, the power supply voltage is decreased (Block 880). Otherwise, the current power supply voltage setting is maintained.

It will be appreciated that variations of the operations illustrated in FIG. 8 may fall within the scope of the present invention. For example, the baseline current (i.e., the current when the transmitter is idle) may be determined at a lower rate (e.g., upon initialization), such that only the transmit burst current need be detected on an ongoing basis.

The flowcharts, flow diagrams and block diagrams of FIGS. 4–8 illustrate architecture, functionality, and operations of possible implementations of devices, methods and computer program products for power amplifier power regulation according to embodiments of the present invention. In this regard, each block in the flow charts or block diagrams may represent a module, segment, or portion of code, which includes one or more executable instructions for implementing the specified logical act(s). It should also be noted that, in some alternative implementations, the acts noted in the blocks may occur out of the order noted in the figures. For example, two blocks shown in succession may, in fact, be executed substantially concurrently, or the blocks may sometimes be executed in the reverse order, depending upon the functionality involved.

In the drawings and specification, there have been disclosed typical illustrative embodiments of the invention and, although specific terms are employed, they are used in a generic and descriptive sense only and not for purposes of limitation, the scope of the invention being set forth in the following claims.

That which is claimed:

1. A method of controlling a transmit power amplifier of a wireless terminal, the method comprising:
   determining a power supply voltage applied to the transmit power amplifier;
   determining a power supply current provided to the transmit power amplifier;
   determining a relationship of the determined power supply current and the determined power supply voltage, including determining whether the power supply current meets a predetermined criterion associated with the determined power supply voltage; and
   controlling the power supply voltage responsive to the determined relationship of the power supply current and the power supply voltage.

2. A method according to claim 1, wherein determining whether the power supply current meets a predetermined criterion comprises determining whether the determined power supply current falls within a predetermined range associated with the determined power supply voltage.

3. A method according to claim 1:
   wherein the terminal is configured to provide a plurality of discrete power supply voltage settings;
   wherein determining a power supply voltage comprises identifying a current power supply voltage setting of the plurality of discrete power supply voltage settings;
   wherein determining a power supply current comprises determining a power supply current provided to the transmit power amplifier for the current power supply voltage setting;

wherein determining a relationship of the determined power supply current and the determined power supply voltage comprises determining a relationship of the determined power supply current and the current power supply voltage setting; and wherein controlling the power supply voltage comprises:
maintaining the current power supply voltage setting if the determined power supply current is within a range of power supply currents associated with the current power supply voltage setting; and/or
selecting a new power supply voltage setting from the plurality of discrete power supply voltage settings if the determined power supply current is outside of the range of power supply currents associated with the current power supply voltage setting.

4. A method according to claim 3, further comprising initializing the terminal to one of the plurality of discrete power supply voltage settings upon establishment of a call.

5. A method according to claim 3, further comprising storing a lookup table tat correlates respective ones of the plurality of discrete power supply voltage settings to respective ranges of power supply currents, and wherein determining a relationship of the determined power supply current and the current power supply voltage setting comprises accessing the lookup table to determine whether the determined power supply current is within the stored range of power supply currents associated with the current power supply voltage setting.

6. A method according to claim 1, wherein the wireless terminal supports a plurality of operating modes for communicating according to respective communications protocols, and wherein the method further comprises controlling the power supply voltage responsive to a relationship of transmit power amplifier power supply voltage and current in only a subset of the plurality of modes.

7. A method according to claim 1, wherein determining a power supply current comprises determining the power supply current during a transmit burst.

8. A method of controlling a transmit power amplifier of a wireless terminal, the method comprising:
regulating a DC power delivered to a power supply input of the power amplifier by adjusting a power supply voltage provided to the power amplifier to keep the DC power delivered to the power supply input substantially constant over a range of load impedances coupled to an output of the power amplifier.

9. A method according to claim 8, wherein regulating a DC power delivered to the power supply input comprises:
determining a power supply voltage and current of the power amplifier; and
regulating the DC power delivered to the power supply input responsive to the determined power supply voltage and current.

10. A method according to claim 8, wherein regulating a DC power delivered to the power supply input comprises:
identifying a power supply voltage setting for the power amplifier;
detecting a power supply current produced by the power supply voltage setting; and
selecting a power supply voltage setting responsive to the identified power supply voltage setting and the detected power supply current.

11. A method according to claim 10, wherein selecting a power supply voltage setting responsive to the identified power supply voltage setting and the detected power supply current comprises selecting a power supply voltage setting based on whether the detected power supply current meets a criterion associated with the identified power supply voltage setting.

12. A method according to claim 11, wherein the criterion comprises whether the detected power supply current is within a predetermined range of currents associated with the identified power supply voltage setting.

13. A method according to claim 12, wherein selecting a power supply voltage setting based on whether the detected power supply current meets a criterion associated with the identified power supply voltage setting comprises incrementing or decrementing the power supply voltage setting if the detected power supply current is outside of the predetermined range.

14. A wireless terminal comprising:
a radio communications circuit including a transmit power amplifier; and
a power regulator circuit electrically coupled to the radio communications circuit and operative to conform a DC power delivered to a power supply input of the power amplifier to a predetermined power criterion by adjusting a power supply voltage provided to the power amplifier such that the DC power delivered to the power supply input is substantially constant over a range of load impedances coupled to an output of the power amplifier.

15. A terminal according to claim 14, wherein the power regulator circuit is operative to determine a power supply voltage and current of the power amplifier and to control the DC power delivered to the power supply input responsive to the determined power supply voltage and current.

16. A terminal according to claim 14, wherein the power regulator circuit is operative to identify a power supply voltage setting for the power amplifier, to detect a power supply current produced by the power supply voltage setting, and to select a power supply voltage setting responsive to the identified power supply voltage setting and the detected power supply current.

17. A terminal according to claim 16, wherein the power regulator circuit is operative to select a power supply voltage setting based on whether the detected power supply current meets a criterion associated with the identified power supply voltage setting.

18. A terminal according to claim 17, wherein the criterion comprises whether the detected power supply voltage is within a predetermined range of currents associated with the identified power supply voltage setting.

19. A terminal according to claim 18, wherein the power regulator circuit is operative to increment or decrement the power supply voltage setting if the detected power supply current is outside of the predetermined range.

20. A wireless terminal comprising:
a radio communications circuit including a transmit power amplifier; and
a power regulator circuit electrically coupled to the radio communications circuit, operative to determine a power supply voltage applied to the transmit power amplifier and a power supply current provided to the transmit power amplifier, to determine whether the determined power supply current meets a predetermined criterion associated with the determined power supply voltage and to responsively control the power supply voltage.

21. A terminal according to claim 20, wherein the predetermined criterion comprises whether the determined power supply current falls within a predetermined range associated with the determined power supply voltage.

22. A terminal according to claim 20, wherein the power regulator circuit is operative to provide a plurality of discrete power supply voltage settings, to identify a current power supply voltage setting of the plurality of discrete power supply voltage settings, to determine a power supply current provided to the transmit power amplifier for the current power supply voltage setting, to determine a relationship of the determined power supply current and the current power supply voltage setting, and to respectively maintain the current power supply voltage setting or select a new power supply voltage setting based on whether the determined power supply current is within or outside of the range of power supply currents associated with the current power supply voltage setting.

23. A terminal according to claim 22, wherein the power regulator circuit is operative to store a lookup table that correlates respective ones of the plurality of discrete power supply voltage settings to respective ranges of power supply currents and to access the lookup table to determine whether the determined power supply current is within the stored range of power supply currents associated with the current power supply voltage setting.

24. A terminal according to claim 20, wherein the radio communications circuit supports a plurality of operating modes for communicating according to respective communications protocols, and wherein the power regulator circuit is operative to control the power supply voltage responsive to a relationship of transmit power amplifier power supply voltage and current in only a subset of the plurality of modes.

25. A wireless terminal, comprising:
a radio communications circuit include a transmit power amplifier;
a sensor operative to detect a power supply current of the transmit power amplifier; and
a processor coupled to the transmit power amplifier and to the sensor and operative to store information correlating respective transmit power amplifier power supply voltage settings to respective ranges of transmit power amplifier power supply current and to select from among the transmit power amplifier voltage settings responsive to the detected power supply current and the stored information.

26. A wireless terminal comprising:
a radio communications circuit including a transmit power amplifier;
means for determining a power supply voltage applied to the transmit power amplifier;
means for determining a power supply current provided to the transmit power amplifier;
means for determining a relationship of the determined power supply current and the determined power supply voltage, including means for determining whether the determined power supply current falls within a predetermined range associated with the determined power supply voltage; and
means for controlling the power supply voltage responsive to the determined relationship of the power supply current and the power supply voltage.

27. A computer program product for controlling a wireless terminal, the computer program product comprising program code embodied in a computer readable medium, the program code comprising:
program code configured to determine a power supply voltage applied to the transmit power amplifier;
program code configured to determine a power supply current provided to the transmit power amplifier;
program code configured to determine a relationship of the determined power supply current and the determined power supply voltage; and
program code configured to control the power supply voltage responsive to the determined relationship of the power supply current and the power supply voltage.

28. A computer program product according to claim 27, wherein the program code configured to determine a relationship of the determined power supply current and the determined power supply voltage comprises program code configured to determine whether the determined power supply current falls within a predetermined range associated with the determined power supply voltage.

29. A computer program product according to claim 27:
wherein the program code configured to determine a power supply voltage comprises program code configured to identify a current power supply voltage setting of the plurality of discrete power supply voltage settings;
wherein the program code configured to determine a power supply current comprises program code configured to determine a power supply current provided to the transmit power amplifier for the current power supply voltage setting;
wherein the program code configured to determine a relationship of the determined power supply current and the determined power supply voltage comprises program code configured to determine a relationship of the determined power supply current and the current power supply voltage setting; and
wherein the program code configured to control the power supply voltage comprises program code configured to selectively maintain the current power supply voltage setting if the determined power supply current is within a range of power supply currents associated with the current power supply voltage setting or select a new power supply voltage setting from the plurality of discrete power supply voltage settings if the determined power supply current is outside of the range of power supply currents associated with the current power supply voltage setting.

* * * * *

UNITED STATES PATENT AND TRADEMARK OFFICE
CERTIFICATE OF CORRECTION

PATENT NO. : 7,102,442 B2  
APPLICATION NO. : 10/833655  
DATED : September 5, 2006  
INVENTOR(S) : William David Anderson

Page 1 of 1

It is certified that error appears in the above-identified patent and that said Letters Patent is hereby corrected as shown below:

Column 9, line 20, please change "tat" to --that--.

Signed and Sealed this

Twenty-eighth Day of November, 2006

JON W. DUDAS  
*Director of the United States Patent and Trademark Office*